(12) United States Patent
Pal

(10) Patent No.: US 9,850,817 B2
(45) Date of Patent: Dec. 26, 2017

(54) CONTROLLER COOLING ARRANGEMENT

(71) Applicant: Hamilton Sundstrand Corporation, Charlotte, NC (US)

(72) Inventor: Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 339 days.

(21) Appl. No.: 14/594,362

(22) Filed: Jan. 12, 2015

(65) Prior Publication Data

US 2016/0201558 A1  Jul. 14, 2016

(51) Int. Cl.
| | |
|---|---|
| H01L 23/38 | (2006.01) |
| F02C 7/16 | (2006.01) |
| H05K 7/20 | (2006.01) |
| F01D 25/12 | (2006.01) |
| F02C 7/12 | (2006.01) |
| F02C 7/26 | (2006.01) |
| F02C 9/00 | (2006.01) |
| G06F 1/20 | (2006.01) |
| F02C 7/224 | (2006.01) |

(52) U.S. Cl.
CPC .............. *F02C 7/16* (2013.01); *F01D 25/12* (2013.01); *F02C 7/12* (2013.01); *F02C 7/26* (2013.01); *F02C 9/00* (2013.01); *G06F 1/20* (2013.01); *H05K 7/20509* (2013.01); *F02C 7/224* (2013.01); *F05D 2260/20* (2013.01); *F05D 2270/54* (2013.01); *H01L 23/38* (2013.01)

(58) Field of Classification Search
CPC ......... H01L 23/38; G06F 1/20; H05K 1/0203; H05K 2201/10219; H05K 7/20509; F01D 25/12; F02C 7/12; F02C 7/16; F02C 7/224; F02C 7/26; F02C 9/00; F05D 2260/20; F05D 2270/54
USPC ................................ 361/688, 702, 711, 720
See application file for complete search history.

(56) References Cited

U.S. PATENT DOCUMENTS

| | | |
|---|---|---|
| 3,714,981 A | 2/1973 | Noren |
| 4,047,198 A | 9/1977 | Sekhon et al. |
| 4,671,349 A | 6/1987 | Wolk |
| 4,910,642 A | 3/1990 | Downing |
| 4,944,344 A | 7/1990 | Crowe |
| 4,947,287 A | 8/1990 | Hoppe |
| 4,956,626 A | 9/1990 | Hoppe et al. |
| 5,088,005 A | 2/1992 | Ciaccio |
| 6,058,010 A * | 5/2000 | Schmidt .......... F28F 3/022 165/80.4 |
| 6,076,595 A | 6/2000 | Austin et al. |
| 6,317,321 B1 | 11/2001 | Fitch et al. |
| 6,768,278 B2 | 7/2004 | Xu et al. |

(Continued)

FOREIGN PATENT DOCUMENTS

EP    1905986 A2    4/2008

OTHER PUBLICATIONS

European Search Report for European Application No. 16150524.3 dated Jun. 2, 2016.

*Primary Examiner* — James Wu
(74) *Attorney, Agent, or Firm* — Carlson, Gaskey & Olds, P.C.

(57) ABSTRACT

A controller according to an exemplary aspect of the present disclosure includes, among other things, a cold plate and at least one electronic component mounted to the cold plate by an intermediate thermoelectric cooler.

11 Claims, 2 Drawing Sheets

(56) References Cited

U.S. PATENT DOCUMENTS

| | | |
|---|---|---|
| 7,369,410 B2 | 5/2008 | Chen et al. |
| 7,434,765 B2 | 10/2008 | Zielinski et al. |
| 7,491,916 B1 | 2/2009 | Barber et al. |
| 7,495,914 B2 | 2/2009 | Tilton et al. |
| 7,602,608 B2 | 10/2009 | Tilton et al. |
| 7,821,145 B2 | 10/2010 | Huang et al. |
| 7,883,053 B2 | 2/2011 | Zielinski et al. |
| 8,124,113 B2 | 2/2012 | Peyton et al. |
| 2005/0041397 A1 | 2/2005 | Alford et al. |
| 2007/0103646 A1* | 5/2007 | Young .................. G01J 1/32 353/52 |
| 2008/0168775 A1* | 7/2008 | Windheim .............. F25B 21/02 62/3.7 |
| 2008/0283219 A1* | 11/2008 | Wyatt .................... F28F 13/00 165/80.4 |
| 2009/0008063 A1 | 1/2009 | Salinas et al. |
| 2012/0201008 A1* | 8/2012 | Hershberger ........ H05K 1/0203 361/720 |
| 2013/0074520 A1* | 3/2013 | Wyatt .................... F25B 21/02 62/3.2 |
| 2013/0285686 A1* | 10/2013 | Malik ................ G01R 31/2875 324/750.05 |

\* cited by examiner

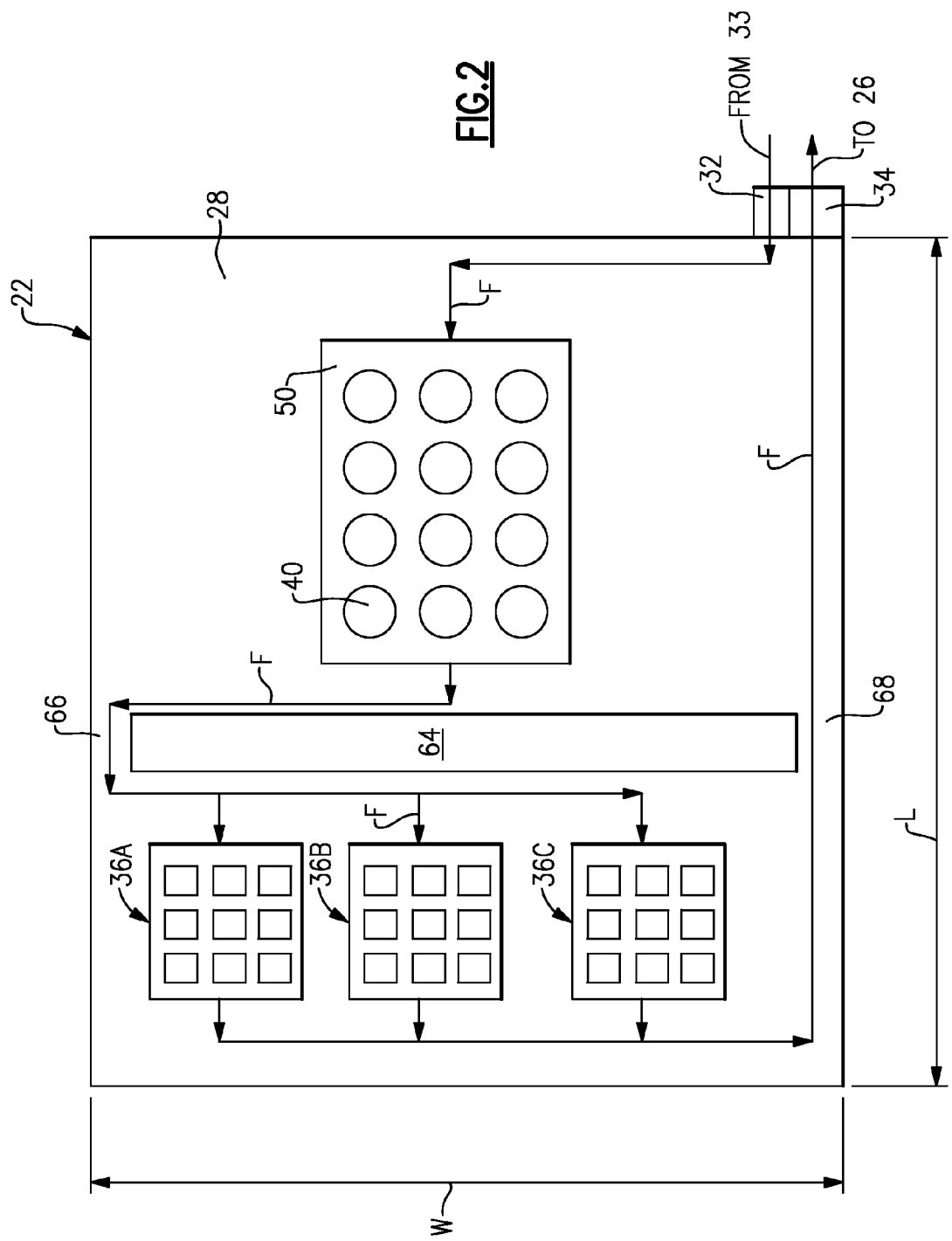

CONTROLLER COOLING ARRANGEMENT

BACKGROUND

Modern electromechanical systems include various components that generate heat. Aircrafts include multiple of these types of systems. One such system is a starter/generator for use with a gas turbine engine. Starter/generators are mechanically coupled to a shaft of the gas turbine engine. In order to start the engine, the starter/generator operates in a "starter" mode and begins to rotate the shaft of the gas turbine engine. When the gas turbine engine is operating, the starter/generator operates in a "generator" mode, and generates power for distribution throughout the aircraft.

Controllers for starter/generators typically include multiple types of electronic components, each of which generates significant heat. This heat must be managed to prevent damage to the electronic components. Some known controllers include electronic components mounted to a cold plate.

Controllers for starter/generators for gas turbine engines are known to use a cold plate, which is cooled by fuel, to manage the temperature of the electronic components. As the fuel absorbs heat from the electronic components, the temperature of the fuel increases, which increases the efficiency of combustion in the engine.

Controllers outside of the context of starter/generators also face similar design challenges.

SUMMARY

A controller according to an exemplary aspect of the present disclosure includes, among other things, a cold plate and at least one electronic component mounted to the cold plate by an intermediate thermoelectric cooler.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE DRAWINGS

The drawings can be briefly described as follows:

FIG. 2 is a top, schematic view of the arrangement of FIG. 1.

DETAILED DESCRIPTION

Figure 1:
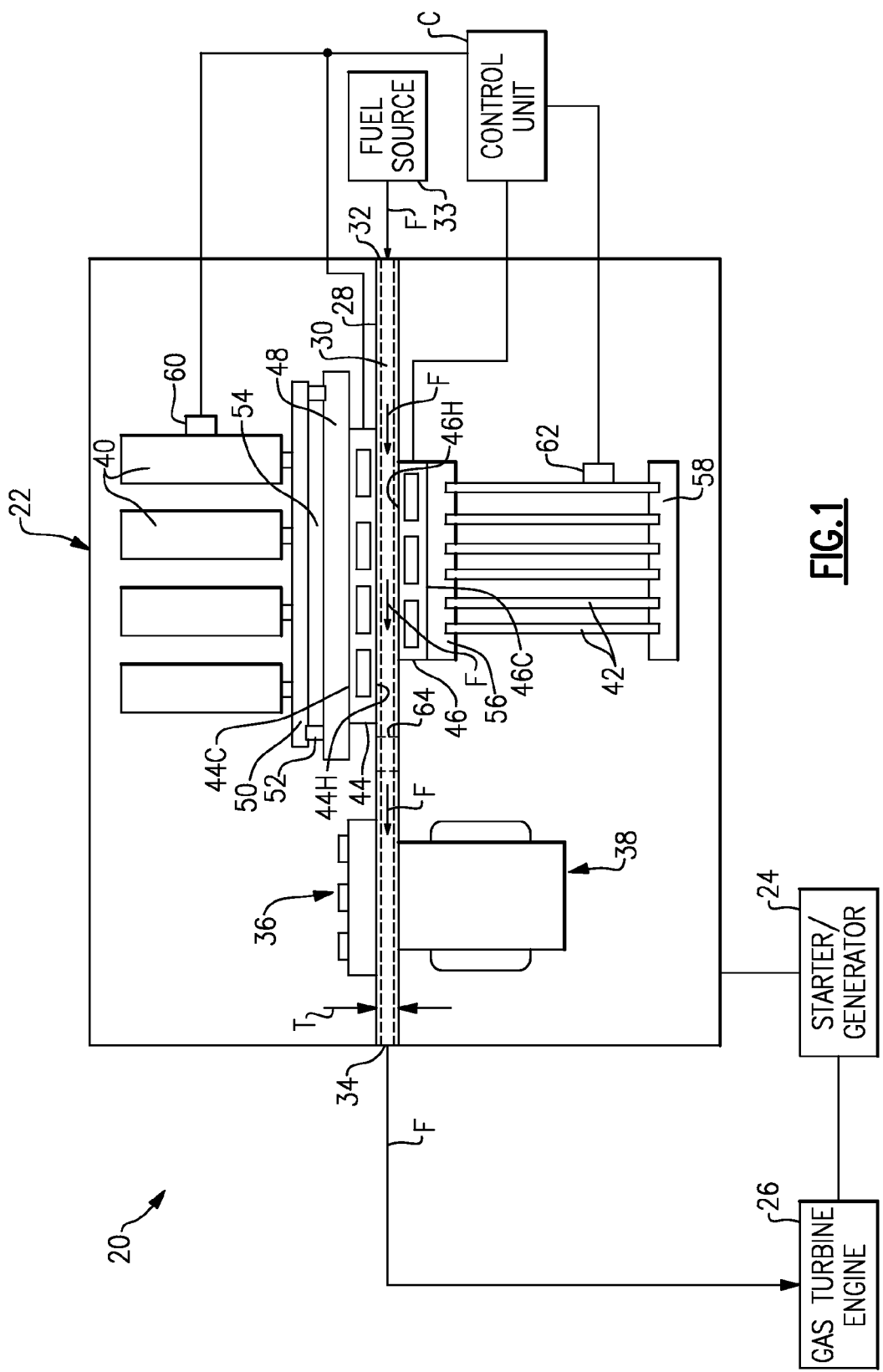
FIG. 1 is a schematic view of a cooling system for a controller.

FIG. 1 schematically illustrates a cooling system 20 associated with a controller 22. In this example, the controller 22 is in electrical communication with a starter/generator 24, which is mechanically coupled to a gas turbine engine 26. To start the gas turbine engine 26, power from the controller 22 is directed to the starter/generator 24. The starter/generator is mechanically coupled to a shaft of the gas turbine engine 26, and is configured to rotate the shaft to begin operation the gas turbine engine 26.

After operation begins, the starter/generator 24 acts as a generator, and directs power to the motor controller 22 for distribution throughout an aircraft, for example. While a particular system 20 is illustrated and discussed herein, this disclosure extends to other types of controllers 22. In particular, this application extends to controllers that are not used with starter/generators.

The controller 22 includes a variety of different electronic components. The various electronic components each have different maximum operating temperatures, which are predetermined (often by the manufacturer of the particular component) and known. If operating above the maximum operating temperate, the components may fail. At a minimum, performance may suffer.

In order to cool the electronic components in the controller 22, the components are mounted, either directly or indirectly, to a cold plate 28. The cold plate 28 includes at least one cooling passageway 30 therein. The passageway 30 includes an inlet 32 in fluid communication with a source 33 of cooling fluid F. In this example, the cooling fluid F is fuel that will ultimately be combusted in the gas turbine engine 26. This disclosure is not limited to embodiments where the cooling fluid F is fuel, although this disclosure may have particular benefits in that instance, as will be appreciated from the below. Other example cooling fluids include liquid dielectrics and glycol coolants.

The passageway 30 further includes a fluid outlet 34, which directs the cooling fluid F downstream from the cold plate 28 and, in this example, ultimately to the gas turbine engine 26 for combustion. As the fluid F flows through the cold plate 28, the fluid F absorbs heat from the electronic components mounted to the cold plate 28.

The increase in the temperature of the fluid F (by virtue of the fluid F flowing through the passageway 30) is desirable and leads to more efficient combustion in the gas turbine engine 26. In one example, the temperature of the fluid F at the inlet 32 may be about 93° C. (197.6° F.). In that example, the temperature of the fluid F at the outlet 34 may be about 101° C. (213.8° F.).

Some of the electronic components in the controller 22 are adequately cooled by the fluid F flowing through the cold plate 28 alone. However, the controller 22 includes some components with a lower maximum operating temperature that require additional, local cooling.

The controller 22 includes at least one power module 36 (there are three power modules 36A-36C in one example, see FIG. 2) and at least one magnetic component 38, each of which are directly mounted to the cold plate 28. In this example, the power modules 36 and the magnetic components 38 may have maximum operating temperatures of 150° C. (302° F.). Thus, these components are adequately cooled by being directly mounted to the cold plate 28. As illustrated, the power module 36 is directly mounted to an upper surface of the cold plate 28, and the magnetic component 38 is directly mounted to a lower surface of the cold plate 28.

The terms "upper" and "lower" are used herein with respect to the orientation of the cold plate 28 in FIG. 1, and are not intended to otherwise be limiting. Further, the term "directly mounted" in this disclosure does not preclude an intermediate thermal paste or compound between components. Rather, as will be appreciated from the below, "directly mounted" means that the components are mounted to the cold plate 28 without an intermediate thermoelectric cooler.

The controller 22 further includes a plurality of electronic components that require additional cooling, such as capacitors 40 and printed wire boards 42 (PWBs). In this example, the capacitors 40 may have a maximum operating temperature of 65° C. (149° F.), and the PWBs 42 may have a maximum operating temperature of 100° C. (212° F.).

In order to provide additional cooling to the components that are rated substantially near, or below, the temperature of the cooling fluid F, intermediate thermoelectric coolers (TECs) 44, 46 are provided between these components and the cold plate 28. Thus, these components are not "directly mounted" to the cold plate.

The TECs 44, 46, may be known types of thermoelectric coolers. TECs operate by the Peltier effect, and include hot nodes 44H, 46H, and cold nodes 44C, 46C. When current flows through a TEC, the current brings heat from the cold nodes 44C, 46C of the device to the hot nodes 44H, 46H, so that one side gets cooler while the other gets hotter. In some embodiments, multiple coolers can be cascaded together to achieve additional cooling.

In the example of FIG. 1, a first TEC 44 is directly mounted to an upper surface of the cold plate 28. In turn, in order to further insulate the capacitors 40 from the cold plate 28, a base plate 48 is mounted to the first TEC 44. The capacitors 40 are mounted to a capacitor support plate 50, which is connected to the base plate 48 by way of a plurality of bus bars 52. The bus bars 52 provide a buffer (or, space) 54 between the base plate 48 and the capacitor support plate 50. The buffer 54 prevents additional, conductive heat transfer from the base plate 48 and provides an appropriate level of thermal insulation for the capacitors 40.

In this example, a second TEC 46 directly contacts a lower surface of the cold plate 28. The second TEC 46 is connected to a first PWB support plate 56. The PWBs 42 are supported between the first PWB support plate 56 and a second PWB support plate 58 opposite the first PWB support plate 56.

As illustrated, the hot nodes 44H, 46H of the first and second TECs 44, 46 are directly mounted to the cold plate 28. The cold nodes 44C, 46C are opposite the cold plate 28. Thus, the TECs 44, 46 direct heat away from the electronic components and toward the cooling fluid F.

Each of the first and second TECs 44, 46 are in communication with a control unit C. The control unit C is in communication with first and second temperature sensors 60, 62, which provide information to the control unit C indicative of the temperature of the capacitors 40 and the PWBs 42, respectively. The control unit C then provides an appropriate level of current to the first and second TECs 44, 46 to adjust the cooling of the capacitors 40 and PWBs 42. While illustrated separately, the control unit C could be incorporated into the controller 22.

FIG. 2 is a top, schematic view of the controller 22. As illustrated in FIG. 2, the inlet 32 and outlet 34 of the passageway 30 may be provided on the same side of the cold plate 28 (while not illustrated that way in FIG. 1). Additionally, the inlet 32 and outlet 34 may include quick connect fittings.

Further, in order to thermally insulate the electronic components that require additional cooling, the cold plate 28 includes a cutout 64 substantially extending along the entire width W of the cold plate 28. The cutout 64 extends through the entire thickness T of the cold plate 28 (see FIG. 1) and essentially separates the cold plate 28 along its length L into a relatively high temperature components side (e.g., the left side, relative to FIG. 2, of the cutout 64) and a relatively low temperature components side (e.g., the right side of the cutout 64).

The cutout 64 does not obstruct the flow of cooling fluid F through the cold plate 28. The cold plate 28 includes narrow portions 66, 68 that allow a flow of cooling fluid F on opposite ends of the cutout 64. The heat conducted through the cold plate 28 (e.g., from the left side to the right side) is limited to the relatively narrow portions 66, 68, which substantially impedes heat transfer from the relatively high temperature components to the relatively low temperature components on the opposite side of the cutout 64.

The disclosed arrangement of the motor controller 22 allows for higher cooling fluid F inlet temperatures, and a correspondingly higher cooling fluid F outlet temperatures. Thus, the disclosed arrangement increases combustion efficiency without compromising the operation of the electric components that require additional cooling.

Although the different examples have the specific components shown in the illustrations, embodiments of this disclosure are not limited to those particular combinations. It is possible to use some of the components or features from one of the examples in combination with features or components from another one of the examples.

One of ordinary skill in this art would understand that the above-described embodiments are exemplary and non-limiting. That is, modifications of this disclosure would come within the scope of the claims. Accordingly, the following claims should be studied to determine their true scope and content.

What is claimed is:

1. A controller, comprising:
   a cold plate;
   at least one electronic component mounted to the cold plate by a thermoelectric cooler; and
   at least one electronic component directly mounted to the cold plate without a thermoelectric cooler;
   wherein the cold plate includes a cutout extending through an entirety of a thickness of the cold plate and extending along substantially an entirety of a width of the cold plate, wherein the at least one electronic component mounted to the cold plate by the thermoelectric cooler is mounted on a first side of the cutout and the at least one electronic component directly mounted to the cold plate is mounted on a second side of the cutout.

2. The controller as recited in claim 1, wherein the at least one electronic component mounted to the cold plate by the thermoelectric cooler has a lower maximum operating temperature rating than the at least one electronic component directly mounted to the cold plate.

3. The controller as recited in claim 1, wherein the at least one electronic component directly mounted to the cold plate includes one of power modules and magnetic components.

4. The controller as recited in claim 1, wherein the at least one component mounted to the cold plate by the thermoelectric cooler includes one of capacitors and printed wire boards (PWBs).

5. The controller as recited in claim 4, wherein the thermoelectric cooler is a first thermoelectric cooler, and further comprising a second thermoelectric cooler, the first and second thermoelectric coolers directly mounted to the cold plate, wherein capacitors are mounted to the first thermoelectric cooler, and PWBs are mounted to the second thermoelectric cooler.

6. The controller as recited in claim 5, wherein the first and second thermoelectric coolers are mounted to opposite sides of the cold plate.

7. The controller as recited in claim 5, wherein a base plate is mounted directly to the first thermoelectric cooler, and wherein a capacitor support plate is spaced-apart from the base plate by a plurality of bus bars, the capacitors mounted to the capacitor support plate.

8. The controller as recited in claim 1, wherein the cold plate includes at least one fluid passageway, the at least one fluid passageway having an inlet in communication with a source of cooling fluid, wherein the at least one fluid passageway is arranged such that fluid flowing through the cold plate between the first and second sides flows around the cutout and passes through at least one narrow portion between an end of the cutout and an end of the cold plate.

9. The controller as recited in claim 8, wherein the at least one narrow portion includes a first narrow portion between a first end of the cutout and a first end of the cold plate, and a second narrow portion between a second end of the cutout and a second end of the cold plate.

10. The controller as recited in claim 8, wherein the cooling fluid is fuel for a gas turbine engine.

11. A controller, comprising:
a cold plate;
at least one electronic component mounted to the cold plate by a thermoelectric cooler; and at least one electronic component directly mounted to the cold plate without a thermoelectric cooler;
wherein the cold plate includes a cutout extending through an entirety of a thickness of the cold plate, wherein the at least one electronic component mounted to the cold plate by the thermoelectric cooler is mounted on a first side of the cutout and the at least one electronic component directly mounted to the cold plate is mounted on a second side of the cutout; and
wherein the cold plate includes at least one fluid passageway arranged such that fluid flowing through the cold plate between the first and second sides flows around the cutout.

* * * * *